(12) United States Patent
Koike

(10) Patent No.: US 8,686,785 B2
(45) Date of Patent: Apr. 1, 2014

(54) LEVEL SHIFTER

(71) Applicant: Sanken Electric Co., Ltd., Niiza (JP)

(72) Inventor: Kengo Koike, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 13/712,316

(22) Filed: Dec. 12, 2012

(65) Prior Publication Data

US 2013/0181763 A1    Jul. 18, 2013

(30) Foreign Application Priority Data

Jan. 13, 2012  (JP) ................. 2012-005100

(51) Int. Cl.
  *H03L 5/00*    (2006.01)
(52) U.S. Cl.
  USPC ................. 327/333; 326/62; 326/81
(58) Field of Classification Search
  USPC ............ 326/62–63, 80–82; 327/306, 333
  See application file for complete search history.

(56) References Cited

U.S. PATENT DOCUMENTS

| | | | | |
|---|---|---|---|---|
| 6,664,822 | B2 * | 12/2003 | Watabe | 327/108 |
| 7,236,020 | B1 * | 6/2007 | Virgil | 327/108 |
| 2011/0115542 | A1 | 5/2011 | Koike | |
| 2012/0212270 | A1 * | 8/2012 | Ishimatsu | 327/198 |
| 2012/0229165 | A1 * | 9/2012 | Tseng et al. | 326/82 |

FOREIGN PATENT DOCUMENTS

JP  2011-109843  6/2011

* cited by examiner

*Primary Examiner* — Dinh T. Le
(74) *Attorney, Agent, or Firm* — Oblon, Spivak, McClelland, Maier & Neustadt, L.L.P.

(57) ABSTRACT

A level shifter includes a resistor R1 connected to a power source, a MOSFET MN3 having a drain connected to the resistor R1 and a grounded source, a resistor R2 having the same resistance of the resistor R1 and connected to the power source, a MOSFET MN4 having a drain to the resistor R2 and a grounded source, a pulse generator 10 controlling ON/OFF of the MOSFETs MN3 and MN4 according to an input signal, a control part generating a set signal when the MOSFET MN3 is ON and a reset signal when the MOSFET MN4 is ON, a flip-flop that providing, according to the set and reset signals, an output signal level-shifted of the input signal to operate a switching element Q1, and a switching operation control part detecting when reference potential decreases to negative and stopping the switching element Q1.

4 Claims, 13 Drawing Sheets

LEVEL SHIFTER

BACKGROUND OF THE INVENTION

1. Field of the Invention

The present invention relates to a level shifter capable of improving the safety of a high-side driver.

2. Description of Related Art

FIG. 1 is a circuit diagram illustrating a level shifter according to a related art. This level shifter includes resistors R1 to R7, a pulse generator 10, transistors MN1 to MN4, a flip-flop FF1, a buffer BF1, and inverters INV4 and INV5.

The resistor R1 has a first end connected to a power source of the level shifter and a second end connected to a drain of the transistor MN3. The transistor MN3 has the drain connected to the second end of the resistor R1, a source connected through the resistor R3 to the ground, and a gate connected to the pulse generator 10. Between the drain of the transistor MN3 and the ground, there is parasitic capacitance C1. The resistor R2 has the same resistance value as the resistor R1 and includes a first end connected to the power source of the level shifter and a second end connected to a drain of the transistor MN4.

The transistor MN4 has the drain connected to the second end of the resistor R2, a source connected through the resistor R4 to the ground, and a gate connected to the pulse generator 10. Between the drain of the transistor MN4 and the ground, there is parasitic capacitance C2.

According to an input signal, the pulse generator 10 turns on/off the transistors MN3 and MN4. As illustrated in FIG. 1 under the pulse generator 10, the pulse generator 10 provides the gate of the transistor MN3 with a set pulse signal in response to a rise of the input signal and the gate of the transistor MN4 with a reset pulse signal in response to a fall of the input signal.

The resistors R5 and R6 and transistors MN1 and MN2 faun. a control part. The control part generates a set signal if the transistor MN3 is ON, a reset signal if the transistor MN4 is ON, and no signal if there is no voltage difference between the drain of the transistor MN3 and the drain of the transistor MN4.

The resistor R5 has a first end connected to the power source of the level shifter and a second end connected to a drain of the transistor MN1. The transistor MN1 has the drain connected to the second end of the resistor R5, a source connected to the drain of the transistor MN3, and a gate connected to the drain of the transistor MN4. The drain of the transistor MN1 is also connected through the inverter INV4 to a set terminal S of the flip-flop FF1.

The resistor R6 has the same resistance value as the resistor R5 and includes a first end connected to the power source of the level shifter and a second end connected to a drain of the transistor MN2. The transistor MN2 has the drain connected to the second end of the resistor R6, a source connected to the drain of the transistor MN4, and a gate connected to the drain of the transistor MN3. The drain of the transistor MN2 is also connected through the inverter INV5 to a reset terminal R of the flip-flop FF1.

The resistors R5 and R6 are pull-up resistors for the transistors MN1 and MN2, respectively. There is a relationship of R1<<R5. The resistor R1 primarily converts a low-side driving current into a voltage whose amplitude is dependent on the resistance value of the resistor R1. The transistors MN1 and MN2 form a common mode rejection circuit, so that a voltage difference between a voltage across the resistor R1 and a voltage drop by the transistor MN1 is equal to a voltage across the resistor R5 that is to be detected. The same is applicable to the resistor R2 side.

Potential of the power source of the level shifter is potential at a positive electrode of a power source E2 and reference potential of the level shifter is potential at a negative electrode of the power source E2. The power source E2 is connected in parallel with a capacitor C1. The negative electrode of the power source E2, i.e., the reference potential of the level shifter is connected to a connection point between a source of a switching element Q1 and a load L. A threshold of each of the detective inverters INV4 and INV5 connected to the resistors R5 and R6, respectively, is properly set in the range of 20% to 80% of a voltage difference between the power source potential and the reference potential.

According to a set or reset signal generated by the control part, the flip-flop FF1 provides a level-shifted output signal OUT, which is a level-shifted signal of an input signal. The output signal OUT from the flip-flop FF1 is applied through the buffer BF1 and resistor R7 to a gate of the high-side switching element Q1. A drain of the switching element Q1 is connected to a DC power source E1 and the source thereof is connected through the load L to the ground.

Operation of the level shifter of FIG. 1 will be explained with reference to the timing chart of FIG. 2 . The operation explained below is when a set pulse is supplied to the level shifter. Operation when a reset pulse is supplied to the level shifter is similar to this.

At time t20, the pulse generator 10 applies the set pulse to the gate of the transistor MN3, to turn on the transistor MN3 and pass a current to the resistor R1. This results in creating a voltage difference between the first and second ends of the resistor R1 and decreasing a source voltage of the transistor MN1. When the gate-source voltage of the transistor MN1 exceeds a threshold voltage thereof, the transistor MN1 turns on to pass a current to the resistor R5. When a voltage drop across the resistor R5 reaches the threshold of the inverter INV4, the inverter INV4 outputs a set signal to the flip-flop FF1. The flip-flop FF1 outputs a high-level signal to the gate of the high-side switching element Q1, thereby turning on the switching element Q1.

Operation of the level shifter of FIG. 1 in an abnormal situation will be explained with reference to the timing chart of FIG. 3. The abnormal situation or a malfunction may occur when the load L is a motor, a transformer, or the like whose circuit pattern involves an inductance component, and if occurs, it may drop the reference potential of the level shifter to negative.

The abnormal situation may also occur when the pulse width of an input signal to the pulse generator 10 is too narrow during, for example, a soft start period or standby period. If the input pulse width is too narrow, the level-shifted output signal OUT from the level shifter will be too thin to properly turn on the switching element Q1 or sustain the reference potential of the level shifter.

In FIG. 3, the reference potential of the level shifter decreases to negative without increasing. Even in a normal state, it is necessary to take into consideration that the reference potential of the level shifter may become negative at the ON/OFF timing of the switching element Q1 due to the reactance components of the load L and circuit patterns. Namely, it is necessary to assume that, during a period in which the reference potential of the level shifter is negative, a set or reset signal is sent from the low side to the high side. It is also necessary to consider that, even when the reference potential is positive, the power source potential may decrease its potential.

If the reference potential of the level shifter becomes 0 [V] or lower, the absolute voltage value of the power source of the level shifter decreases. In this situation, a consideration is made on the series circuit including the resistor R1, transistor MN3, and resistor R3 to transfer a set signal from the low side to the high side. When the transistor MN3 turns on in response to a set signal from the pulse generator 10, a voltage dividing ratio of the series-connected resistors R1 and R3 determines a voltage across the resistor R1. The voltage across the resistor R1 is detected by the control part and inverter INV4 and the set signal is transferred to the high-side switching element Q1.

This related art is disclosed in Japanese Unexamined Patent Application Publication No. 2011-109843.

SUMMARY OF THE INVENTION

If the absolute voltage value of the power source of the level shifter decreases at this time, a voltage across each of the resistors R1 and R2 becomes smaller. At time t31 and t33 in FIG. 3, the voltage across the resistor R6 (R2) is greater than a voltage difference between the power source potential and the threshold VTH of the inverter INV5, and therefore, the inverter INV5 provides the reset terminal R of the flip-flop FF1 with a high-level signal. This inverts the output terminal Q of the flip-flop FF1, to provide a low-level level-shifted signal OUT to the switching element Q1, to turn off the switching element Q1.

At time t35, however, the voltage across the resistor R6 (R2) is smaller than the voltage difference between the power source potential and the threshold VTH of the inverter INV5, and therefore, the inverter INV5 provides the reset terminal R of the flip-flop FF1 with no high-level signal. Accordingly, at time t35, the output terminal Q of the flip-flop FF1 does not invert and keeps the high-level level-shifted output OUT. As a result, the switching element Q1 is not turned off. Namely, no reset signal is transferred from the low side to the high side.

Due to manufacturing variations, the set-side voltage dividing circuit, i.e., the series connected resistors R1 and R3 and the reset-side voltage dividing circuit, i.e., the series connected resistors R2 and R4 are not completely equal to each other even if they are equally designed and structured. This causes an incident illustrated in FIG. 3 that, when the reference potential and the power source potential decrease, only the set side is able to transmit a set signal and the reset side is unable to transmit a reset signal. If this happens, the level shifter output OUT never becomes low and a set pulse wider than an intended set pulse is outputted to the switching element Q1, thereby causing a malfunction.

For example, a high-side driver employing a bridge configuration to connect a low-side switch, a high-side switch, and an input power source in series may cause, in the worst case, a serious trouble of simultaneously turning on the high- and low-side switches and short-circuiting the input power source. If this happens, the switches will be damaged, or a circuit fuse will open to cause an unwanted incident.

The present invention provides a level shifter capable of safely and surely stopping a switching element if reference potential of the level shifter decreases.

According to an aspect of the present invention, the level shifter includes a first resistor having a first end connected to a power source of the level shifter, a first n-type MOSFET having a drain connected to a second end of the first resistor and a source connected to the ground, a second resistor provided with the same resistance value as the first resistor and having a first end connected to the power source, a second n-type MOSFET having a drain connected to a second end of the second resistor and a source connected to the ground, a pulse generator that controls, according to an input signal, ON/OFF of the first and second n-type MOSFETs, a control part that generates a set signal when the first n-type MOSFET is ON and a reset signal when the second n-type MOSFET is ON, a flip-flop that provides, according to the set and reset signals generated by the control part, an output signal that is a level-shifted signal of the input signal to operate a switching element, and a switching operation control part that detects when reference potential of the level shifter at a negative electrode of the power source decreases to negative and stops the operation of the switching element.

DESCRIPTION OF PREFERRED EMBODIMENTS

Level shifters according to embodiments of the present invention will be explained in detail with reference to the drawings.

Embodiment 1

Figure 4:
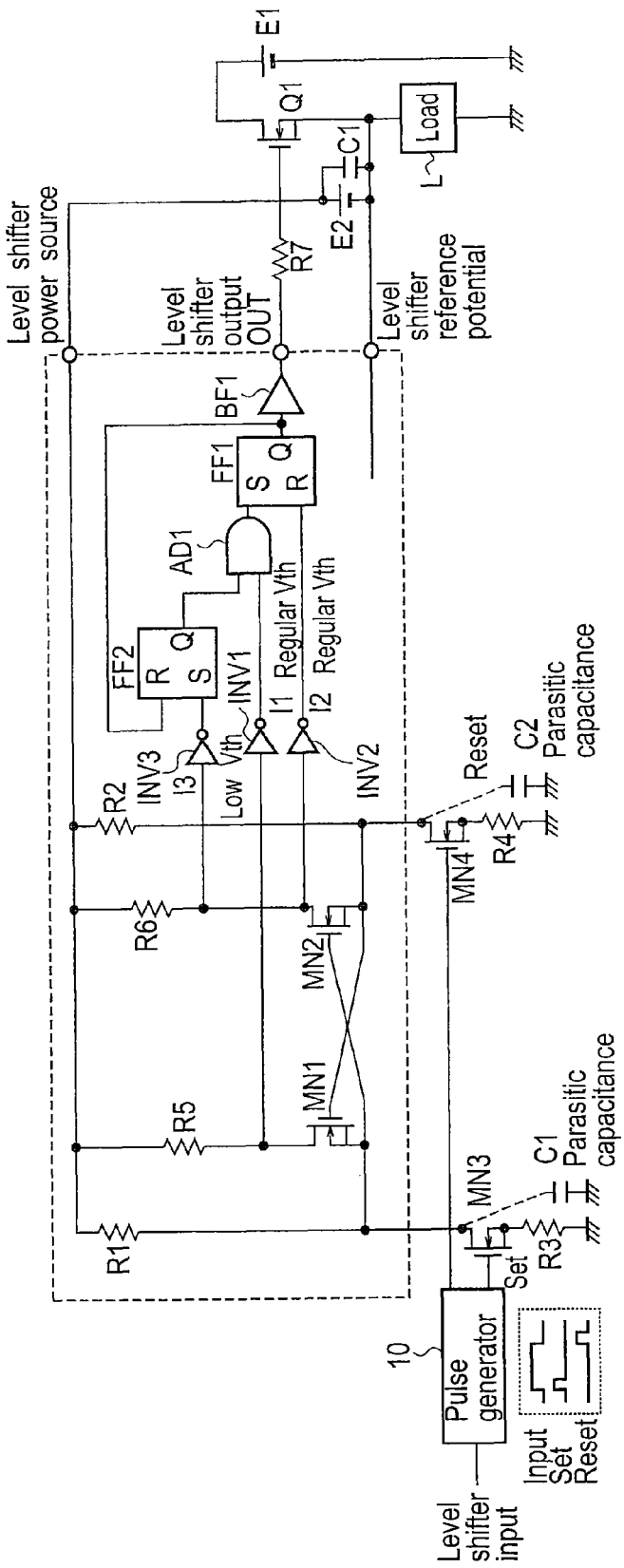
FIG. 4 is a circuit diagram illustrating a level shifter according to Embodiment 1 of the present invention.

FIG. 4 is a circuit diagram illustrating a level shifter according to Embodiment 1 of the present invention. Compared with the level shifter of the related art illustrated in FIG. 1, the level shifter of Embodiment 1 illustrated in FIG. 4 employs a switching operation control part that detects if reference potential of the level shifter decreases to negative and safely and surely stops the operation of a switching element Q1. The switching operation control part includes inverters INV1, INV2, INV3, a flip-flop FF2, and an AND gate AD1.

As illustrated in FIG. 4, the inverter INV1 has an input terminal connected to a second end of a resistor R5 and an output terminal connected to a first input terminal of the AND gate AD1. When a voltage across a resistor R1 (R5) exceeds a voltage difference between a power source potential of the level shifter and a threshold VTH, the inverter INV1 outputs an inverted signal of an input signal to the first input terminal of the AND gate AD1.

The inverter INV2 has an input terminal connected to a second end of a resistor R6 and an output terminal connected to a reset terminal R of a flip-flop FF1. When a voltage across a resistor R2 (R6) exceeds a voltage difference between the power source potential of the level shifter and a first threshold VTH1, the inverter INV2 outputs an inverted signal of the input signal to the reset terminal R of the flip-flop FF1.

The inverter INV3 has an input terminal connected to the second end of the resistor R6 and an output terminal connected to a set terminal S of the flip-flop FF2. When the voltage across the resistor R2 (R6) exceeds a voltage difference between the power source potential of the level shifter and a second threshold VTH2, the inverter INV3 outputs an inverted signal of the input signal to the set terminal S of the flip-flop FF2. Here, the voltage difference between the power source potential and the second threshold VTH2 is greater than the voltage difference between the power source potential and the first threshold VTH1.

The flip-flop FF2 has the set terminal S connected to the output terminal of the inverter INV3, a reset terminal R connected to an output terminal Q of the flip-flop FF1, and an output terminal Q connected to a second input terminal of the AND gate AD1. An output terminal of the AND gate AD1 is connected to a set terminal S of the flip-flop FF1. The output terminal Q of the flip-flop FF1 is connected to an input terminal of a buffer BF1.

Figure 1:
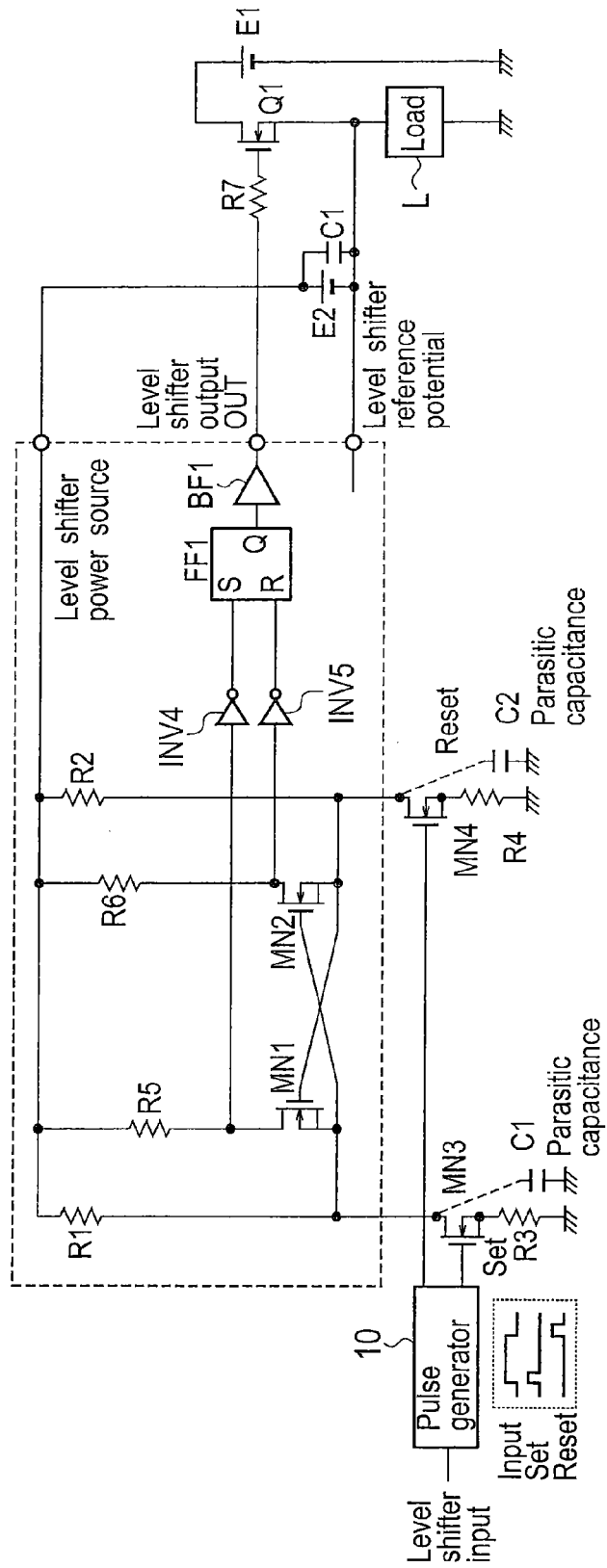
FIG. 1 is a circuit diagram illustrating a level shifter according to a related art.
Figure 2:
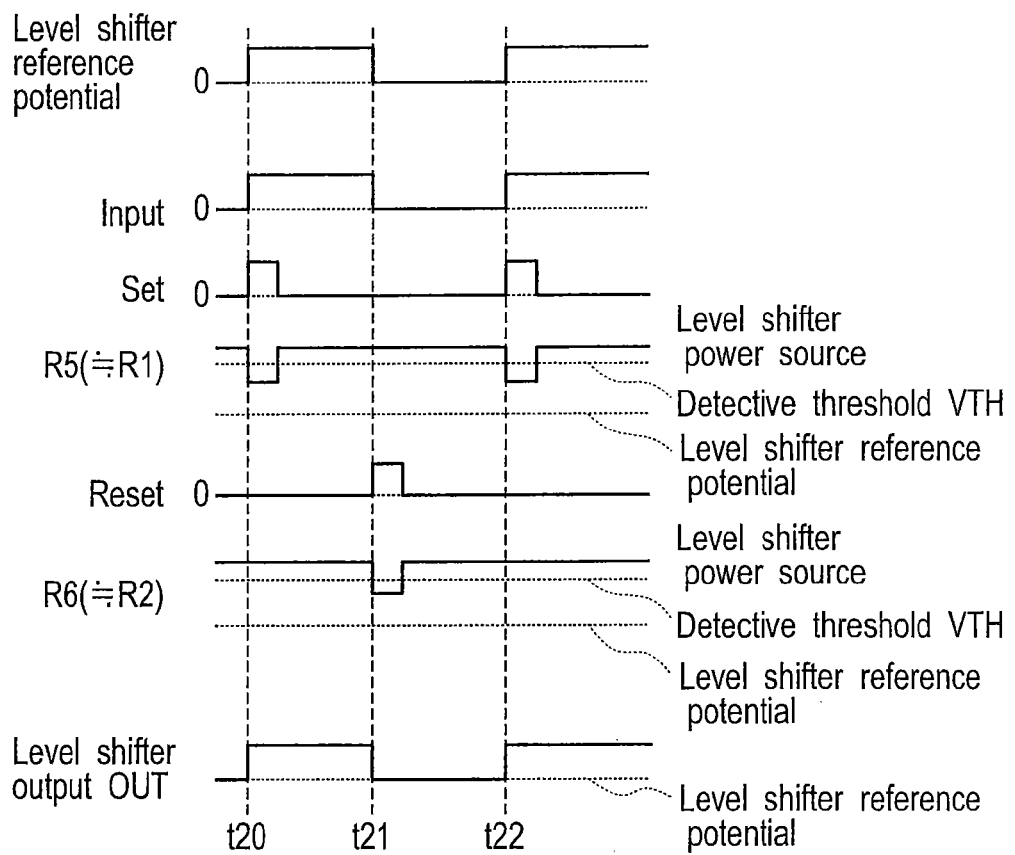
FIG. 2 is a timing chart illustrating operation of the level shifter of FIG. 1 in a normal state.
Figure 3:
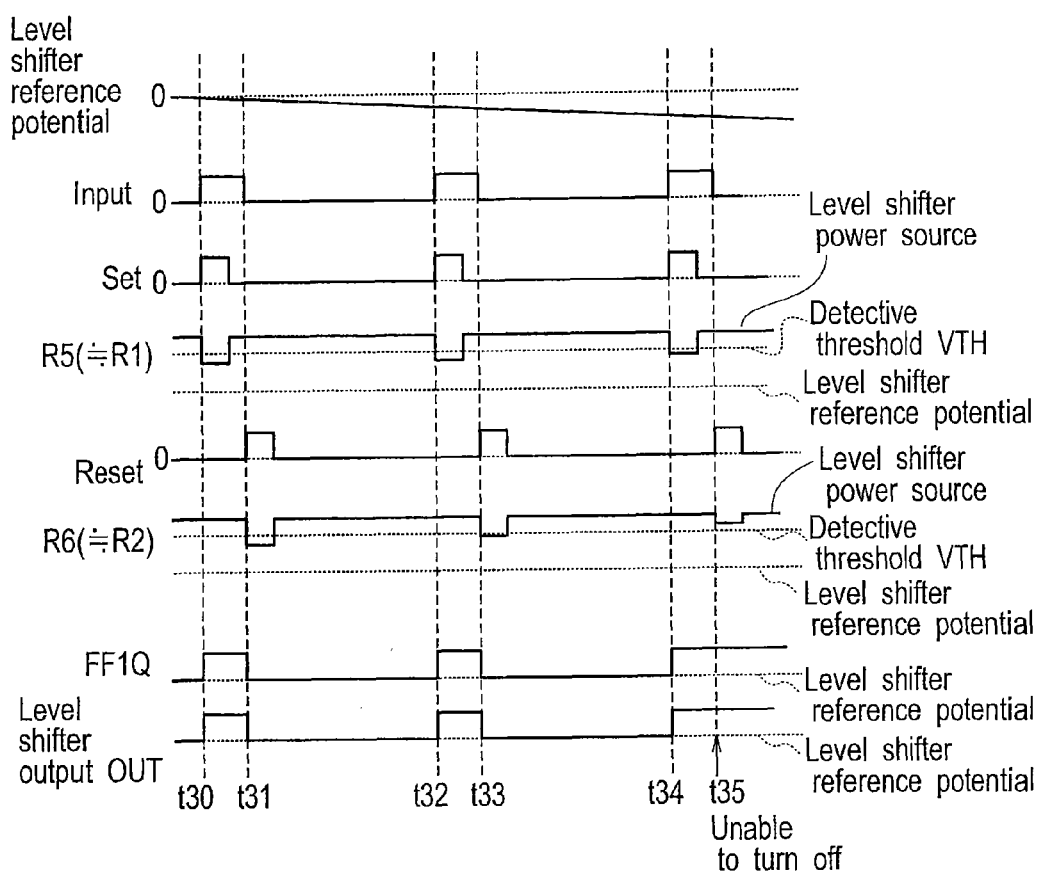
FIG. 3 is a timing chart illustrating operation of the level shifter of FIG. 1 in an abnormal state.

The remaining configuration of FIG. 4 is the same as FIG. 1, and therefore, like parts are represented with like reference marks to omit overlapping explanations.

Operation of the level shifter according to the present embodiment will be explained with reference to the timing chart of FIG. 5.

If the reference potential of the level shifter decreases below zero, or if the power source potential of the level shifter decreases, a voltage across the resistor R1 (R2) when the transistor MN3 (MN4) turns on decreases. A voltage amplitude across the resistor R5 (R6) also decreases. If the voltage amplitude of the resistor R5 (R6) decreases lower than the voltage difference between the power source potential and the threshold VTH (VTH1) of the inverter INV1 (INV2), the inverter INV1 (INV2) outputs no high-level signal, and therefore no set pulse (reset pulse) is provided.

Figure 5:
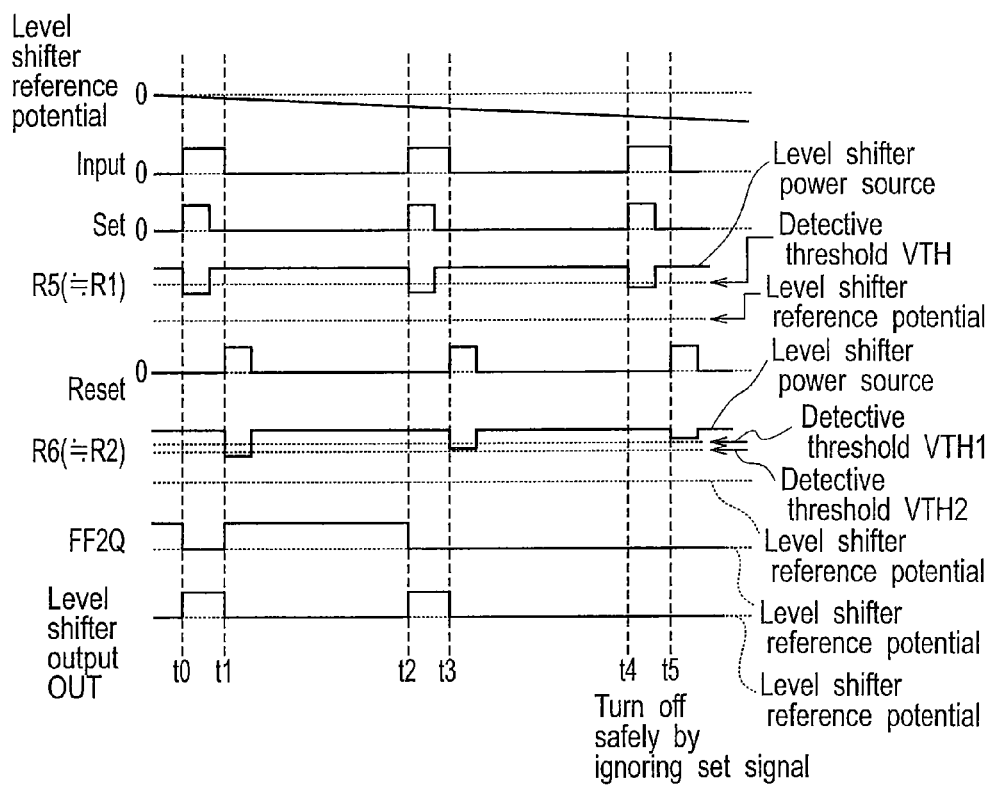
FIG. 5 is a timing chart illustrating operation of the level shifter of FIG. 4 in an abnormal state.

More precisely, at time t1 of FIG. 5, the voltage across the resistor R6 (R2) is greater than the voltage difference between the power source potential and the second threshold VTH2 of the inverter INV3, and therefore, the inverter INV3 outputs a high-level signal to the set terminal S of the flip-flop FF2. As a result, the output Q of the flip-flop FF2 outputs a high-level signal. At this time, the inverter INV2 outputs a high-level signal to the reset terminal R of the flip-flop FF1, and therefore, the output Q of the flip-flop FF1 inverts to output a low-level signal to turn off the switching element Q1.

At time t3, the voltage across the resistor R6 (R2) is smaller than the voltage difference between the power source potential and the second threshold VTH2 of the inverter INV3, and therefore, the inverter INV3 outputs a low-level signal to the set terminal S of the flip-flop FF2. As a result, the output Q of the flip-flop FF2 outputs a low-level signal. At this time, the inverter INV2 outputs a high-level signal to the reset terminal R of the flip-flop FF1, and therefore, the output Q of the flip-flop FF1 inverts to output a low-level signal to turn off the switching element Q1.

In this way, before it becomes unable to detect a set or reset pulse, the inverter INV3 of the present embodiment detects if the amplitude of the resistor R2 (R6) decreases and changes the output Q of the flip-flop FF2 to low. Even if the next set pulse is provided at time t4, the low-level signal from the output Q of the flip-flop FF2 to the AND gate AD1 prevents the level shifter output OUT from providing a high-level pulse, thereby keeping the switching element Q1 OFF.

The thresholds according to the present embodiment are so set that the inverter INV3 may detect, before the inverter INV2 becomes unable to detect a signal, that the voltage amplitude of the resistor R2 (R6) has decreased.

In this way, the level shifter according to Embodiment 1 stops, when the reference potential of the level shifter decreases to negative, the turn-on operation of the switching element Q1, thereby preventing the level shifter from exceeding an operable limit. Namely, Embodiment 1 is capable of safely and surely stopping the operation of the switching element Q1.

Embodiment 2

Figure 6:
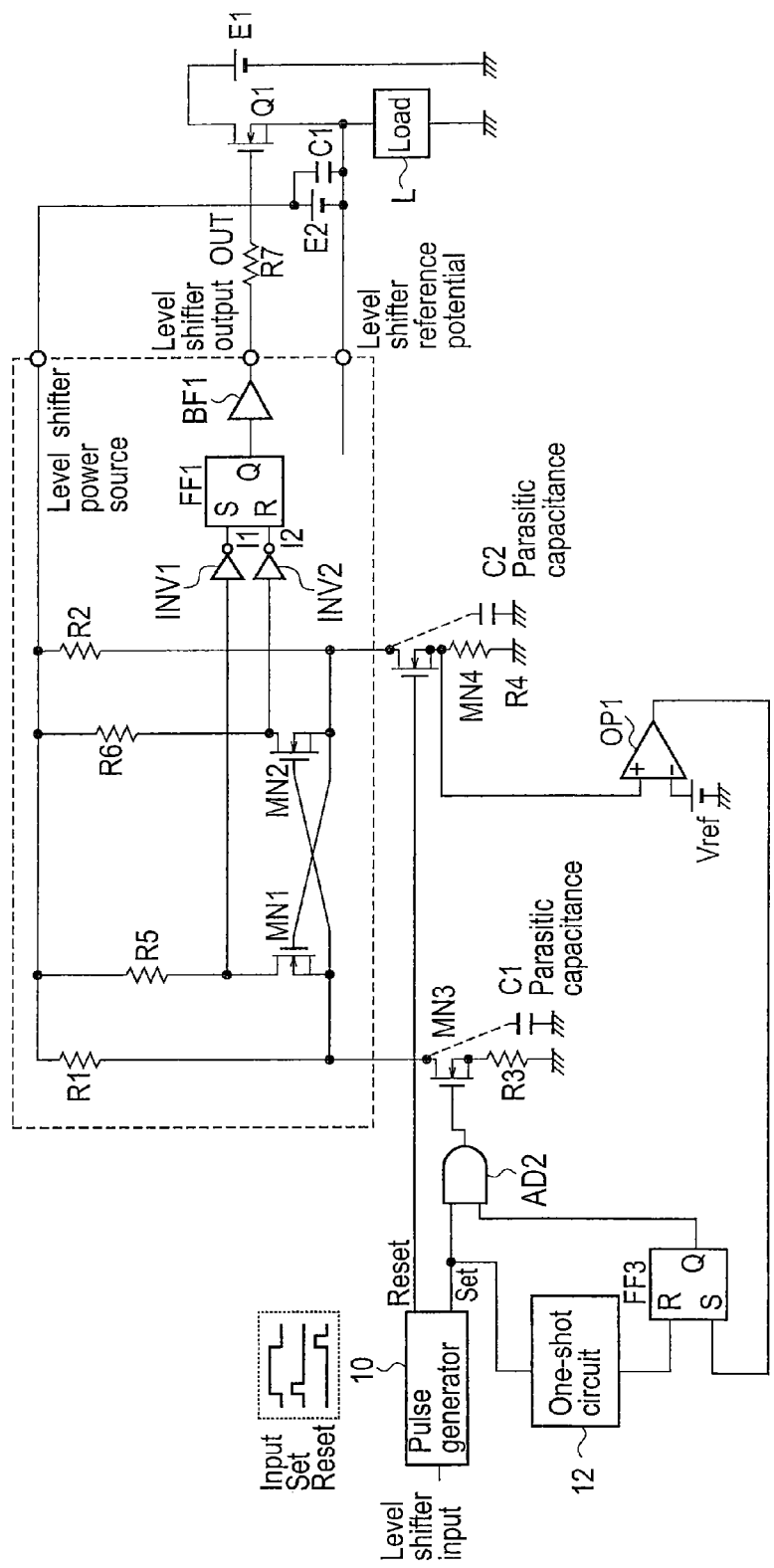
FIG. 6 is a circuit diagram illustrating a level shifter according to Embodiment 2 of the present invention.

FIG. 6 is a circuit diagram illustrating a level shifter according to Embodiment 2 of the present invention. Unlike the level shifter according to Embodiment 1 illustrated in FIG. 4 that arranges, on the high side, the switching operation control part including the inverter INV3, flip-flop FF2, and AND gate AD1, the level shifter according to Embodiment 2 illustrated in FIG. 6 arranges, on the low side, a switching operation control part including a one-shot circuit 12, a comparator OP1, a flip-flop FF3, and an AND gate AD2.

According to the present embodiment, the level shifter detects, on the low side, a voltage across a resistor R3 or R4, and if the detected voltage is too low to send a set or reset signal to the high side, transmits no set signal, thereby stopping the operation of a switching element Q1.

The one-shot circuit 12 detects a falling edge of a set pulse provided by a pulse generator 10 and outputs a one-shot pulse to a reset terminal R of the flip-flop FF3. The comparator OP1 compares a voltage across the resistor R4 with a reference voltage Vref, and if the voltage is equal to or higher than the reference voltage Vref, outputs a high-level signal to a set terminal S of the flip-flop FF3. If the voltage is lower than the reference voltage Vref, the comparator OP1 outputs a low-level signal to the set terminal S of the flip-flop FF3.

The AND gate AD2 operates an AND logic of the set pulse provided by the pulse generator 10 and an output signal from an output terminal Q of the flip-flop FF3 and outputs the AND result to a gate of a transistor MN3.

Figure 7:
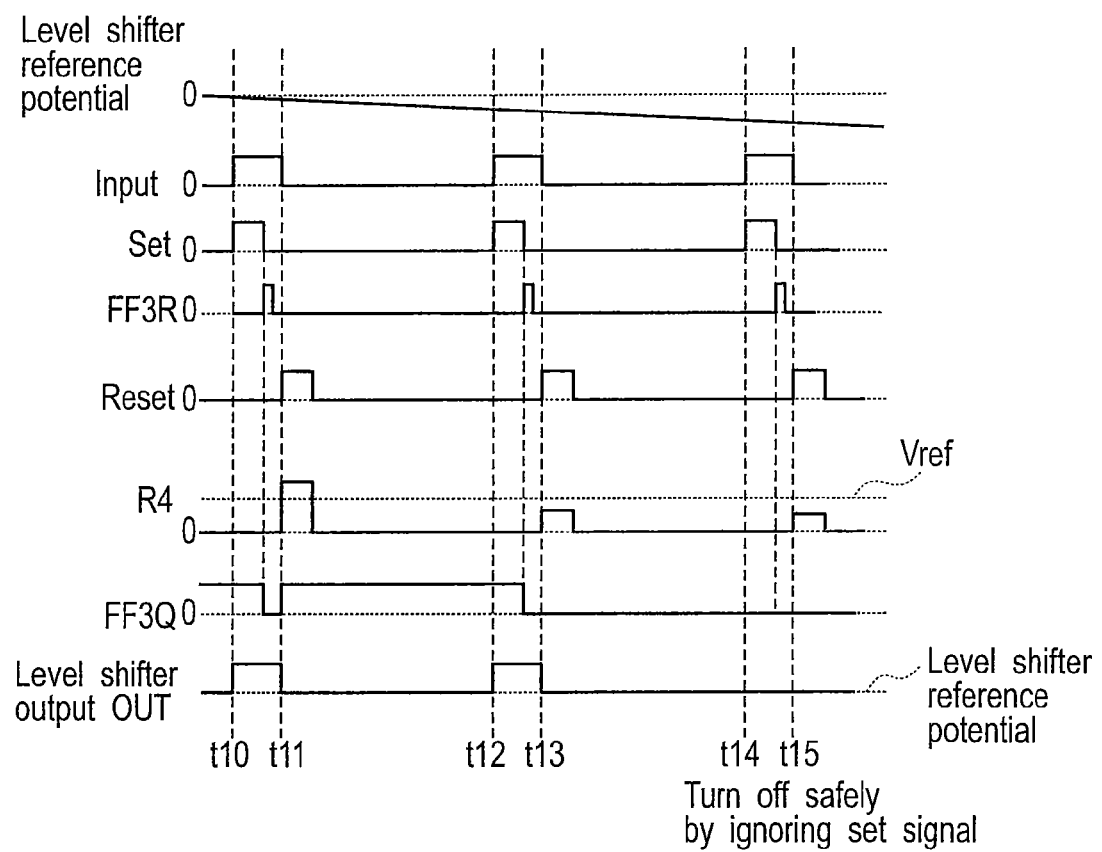
FIG. 7 is a timing chart illustrating operation of the level shifter of FIG. 6 in an abnormal state.

Operation of the level shifter according to the present embodiment in an abnormal state will be explained with reference to the timing chart of FIG. 7.

Before time t11, the one-shot circuit 12 detects a falling edge of a set pulse from the pulse generator 10 and outputs a single pulse to the reset terminal R of the flip-flop FF3. Accordingly, the flip-flop FF3 inverts its output to low.

At time t11, the pulse generator 10 outputs a reset pulse to turn on a transistor MN4 to pass a current through the resistor R4 and generate a voltage across the resistor R4. This voltage is greater than the reference voltage Vref of the comparator OP1, and therefore, the comparator OP1 outputs a high-level signal to the set terminal S of the flip-flop FF3. As a result, the output terminal Q of the flip-flop FF3 becomes high.

At time t13, the pulse generator 10 outputs a reset pulse to turn on the transistor MN4 to provide a current and generate a voltage across the resistor R4. This voltage is smaller than the reference voltage Vref of the comparator OP1, and therefore, the comparator OP1 outputs a low-level signal to the set terminal S of the flip-flop FF3. As a result, the output Q of the flip-flop FF3 becomes low.

At time t14, a set pulse is applied to the AND gate AD2. However, the output Q of the flip-flop FF3 is continuously low, and therefore, the AND gate AD2 outputs a low-level signal not to turn on the transistor MN3. As a result, the set signal is ignored and the operation of the switching element Q1 is safely and surely stopped.

In this way, the level shifter according to Embodiment 2 provides the effect similar to that provided by the level shifter of Embodiment 1.

Embodiment 3

Figure 8:
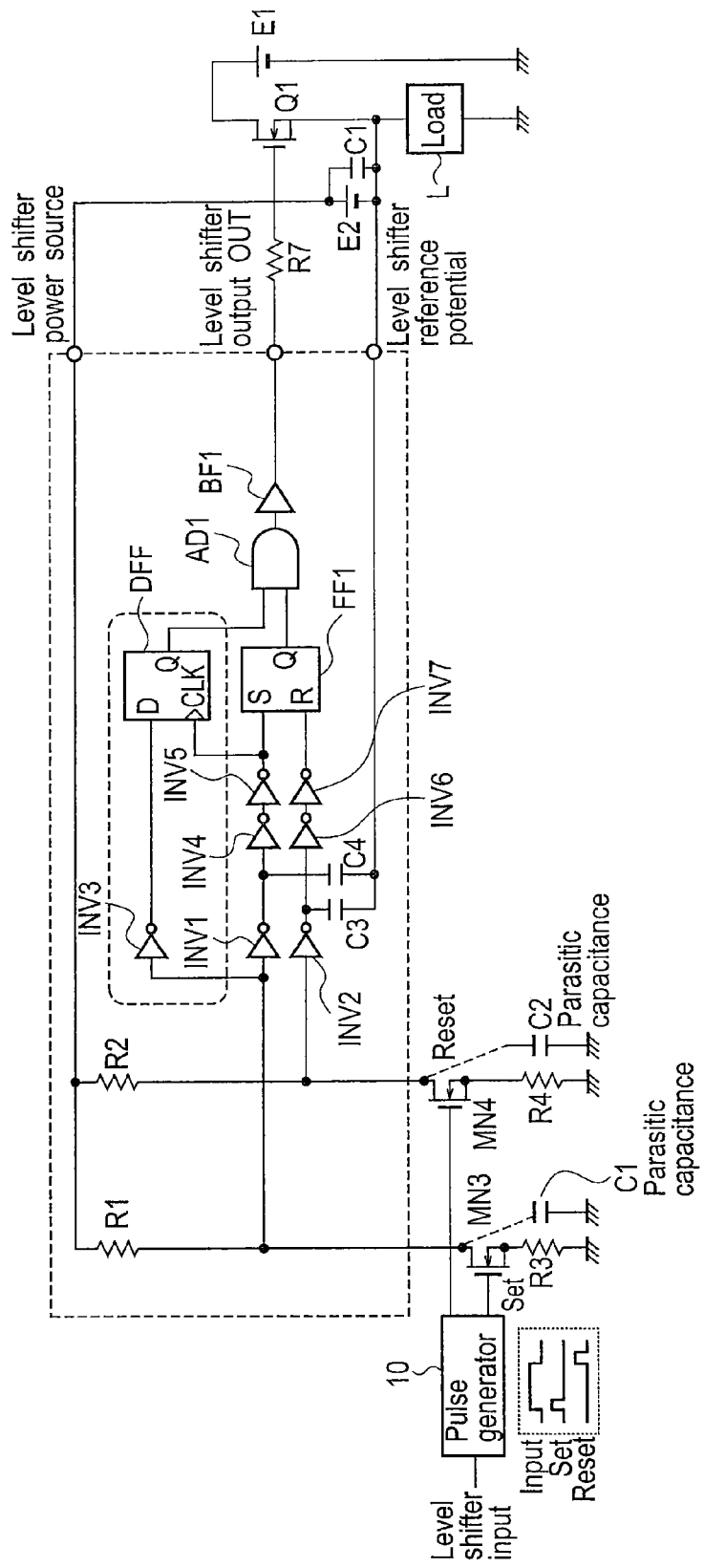
FIG. 8 is a circuit diagram illustrating a level shifter according to Embodiment 3 of the present invention.

FIG. 8 is a circuit diagram illustrating a level shifter according to Embodiment 3 of the present invention. Unlike the level shifter of Embodiment 1 illustrated in FIG. 4 that stops, if the power source potential of the level shifter becomes negative, the switching element Q1 according to both the set and reset signals, the level shifter according to Embodiment 3 illustrated in FIG. 8 stops the switching element Q1 according to one of the set and reset signals if the power source potential of the level shifter becomes negative.

Compared with Embodiment 1 of FIG. 4, Embodiment 3 of FIG. 8 removes the resistors R5 and R6 and transistors MN1 and MN2 and employs inverters INV1 to INV7, a flip-flop FF1, a D-type flip-flop DFF, an AND gate AD1, and a buffer BF1.

The inverter INV1 has an input terminal connected to a second end of a resistor R1 and an output terminal connected through the inverters INV4 and INV5 to a set terminal S of the flip-flop FF1. When a voltage across the resistor R1 exceeds a voltage difference between a power source potential of the level shifter VB and a threshold VTH1, the inverter INV1 outputs an inverted signal of an input signal to an input terminal of the inverter INV4.

The inverter INV2 has an input terminal connected to a second end of a resistor R2 and an output terminal connected through the inverters INV6 and INV7 to a reset terminal R of the flip-flop FF1. When a voltage across the resistor R2 exceeds a voltage difference between the power source potential VB and the threshold VTH1, the inverter INV2 outputs an inverted signal of the input signal to the reset terminal R of the flip-flop FF1.

The inverter INV3 has an input terminal connected to the second end of the resistor R1 and an output terminal connected to a set terminal D of the D-type flip-flop DFF. When the voltage across the resistor R1 exceeds a voltage difference between the power source potential VB and a threshold VTH2, the inverter INV3 outputs an inverted signal of the input signal to the set terminal D of the D-type flip-flop DFF. Here, the voltage difference between the power source potential VB and the threshold VTH2 is greater than the voltage difference between the power source potential VB and the threshold VTH1.

The D-type flip-flop DFF has a clock terminal DFF-CLK connected to an output terminal of the inverter INV5 and an output terminal Q connected to a first input terminal of the AND gate AD1.

The flip-flop FF1 has the set terminal S connected to the output terminal of the inverter INV5, the reset terminal R connected to an output terminal of the inverter INV7, and an output terminal Q connected to a second input terminal of the AND gate AD1. An output terminal of the AND gate AD1 is connected through the buffer BF1 to a level shifter output OUT (HO).

The remaining configuration of FIG. 8 is the same as FIG. 4, and therefore, like parts are represented with like reference marks to omit overlapping explanations.

Figure 9:
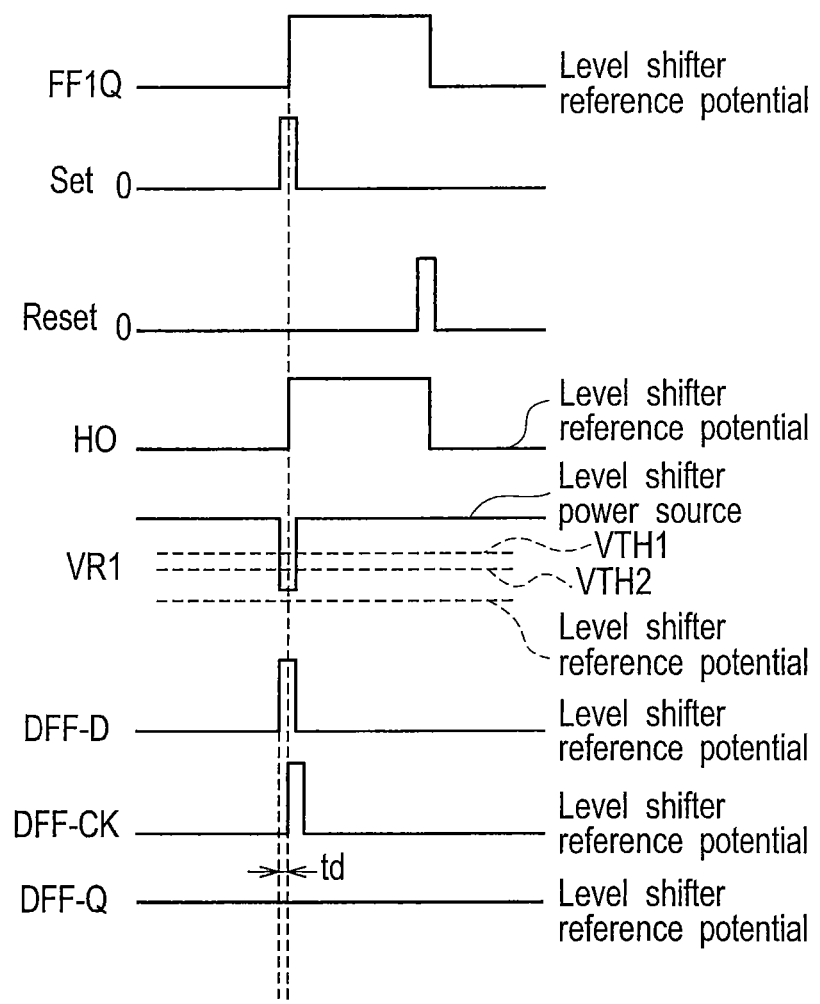
FIG. 9 is a timing chart illustrating operation of the level shifter of FIG. 8 when reference potential of the level shifter is normal.
Figure 10:
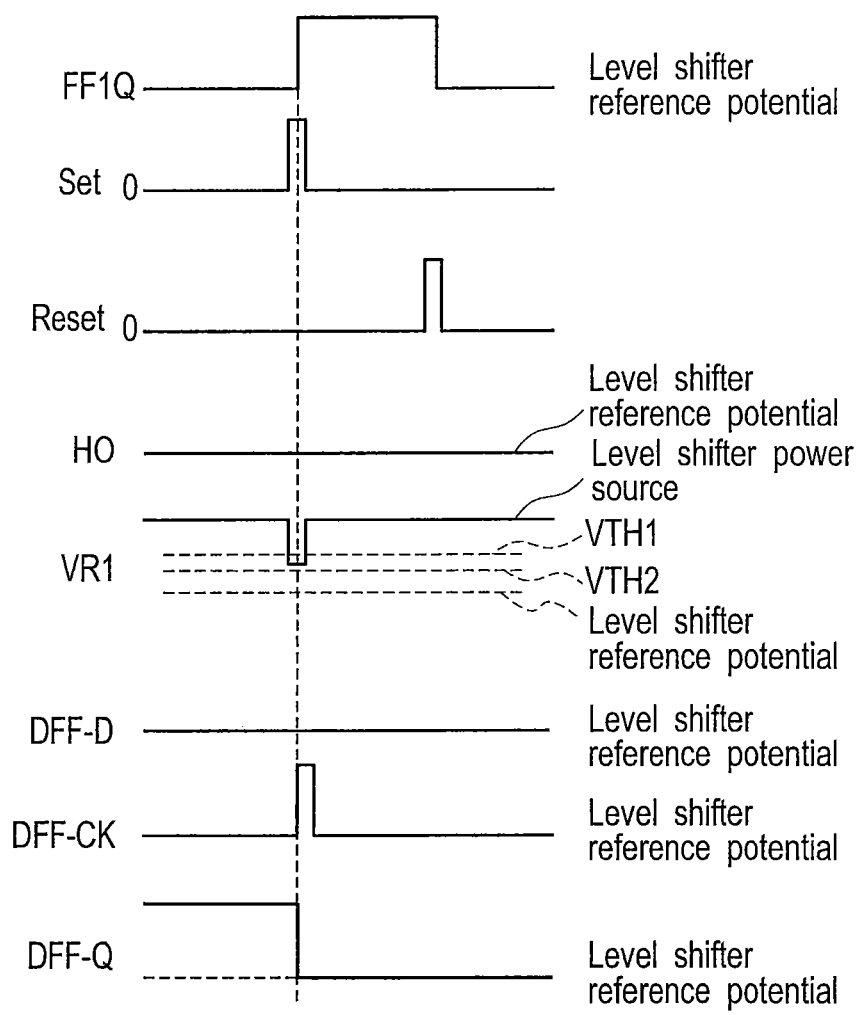
FIG. 10 is a timing chart illustrating operation of the level shifter of FIG. 8 when the reference potential of the level shifter is negative.

Operation of the level shifter according to Embodiment 3 will be explained with reference to the timing charts of FIGS. 9 and 10, in which FIG. 9 is when reference potential of the level shifter VS is normal and FIG. 10 is when the reference potential of the level shifter VS is negative.

When the reference potential of the level shifter VS is equal to or lower than zero, or when power source potential of the level shifter VB decreases, a voltage amplitude across the resistor R1 (R2) when a transistor MN3 (MN4) turns on decreases. If the voltage amplitude decreases to the voltage difference between the power source potential VB and the threshold VTH1 of the inverter INV1 (INV2), the inverter INV1 (INV2) outputs no high-level signal, and therefore, a set (reset) pulse is not provided.

In FIG. 9, the voltage across the resistor R1 is greater than the voltage difference between the power source potential VB and the second threshold VTH2 of the inverter INV3, and therefore, the inverter INV3 outputs a high-level signal to the terminal D (DFF-D) of the D-type flip-flop DFF. The output Q of the D-type flip-flop DFF, therefore, becomes high. Also, the inverter INV1 outputs a high-level signal, which is delayed by a delay time of td through the inverters INV4 and INV5 and is supplied as a clock signal to the clock terminal DFF-CLK of the D-type flip-flop DFF. As a result, at the timing of a rise of this clock signal, a high-level signal is supplied as the level shifter output OUT (HO).

In FIG. 10, the reference potential VS is negative and the voltage VR1 across the resistor R1 becomes smaller than the voltage difference between the power source potential VB and the threshold VTH2 of the inverter INV3. The inverter INV3, therefore, outputs a low-level signal to the terminal D of the D-type flip-flop DFF. As a result, the output Q of the D-type flip-flop DFF becomes low and the buffer BF1 outputs a low-level signal as the level shifter output OUT.

In this way, before becoming incapable of detecting a set or reset pulse, the level shifter of the present embodiment detects a decrease in the voltage amplitude of the resistor R1 with the use of the inverter INV3 and prevents a pulse from being provided through the AND gate AD1 and buffer BF1 to the level shifter output OUT.

If the reference potential VS becomes negative, the level shifter according to Embodiment 3 stops the turn-on operation of the switching element Q1 before reaching an operation limit at which no level shifting operation is possible. Namely, Embodiment 3 is capable of safely and surely stopping the operation of the switching element Q1.

In addition, the level shifter according to Embodiment 3 is capable of stopping the switching element Q1 according to a set signal when the reference potential of the level shifter becomes negative.

Modification of Embodiment 3

Figure 11:
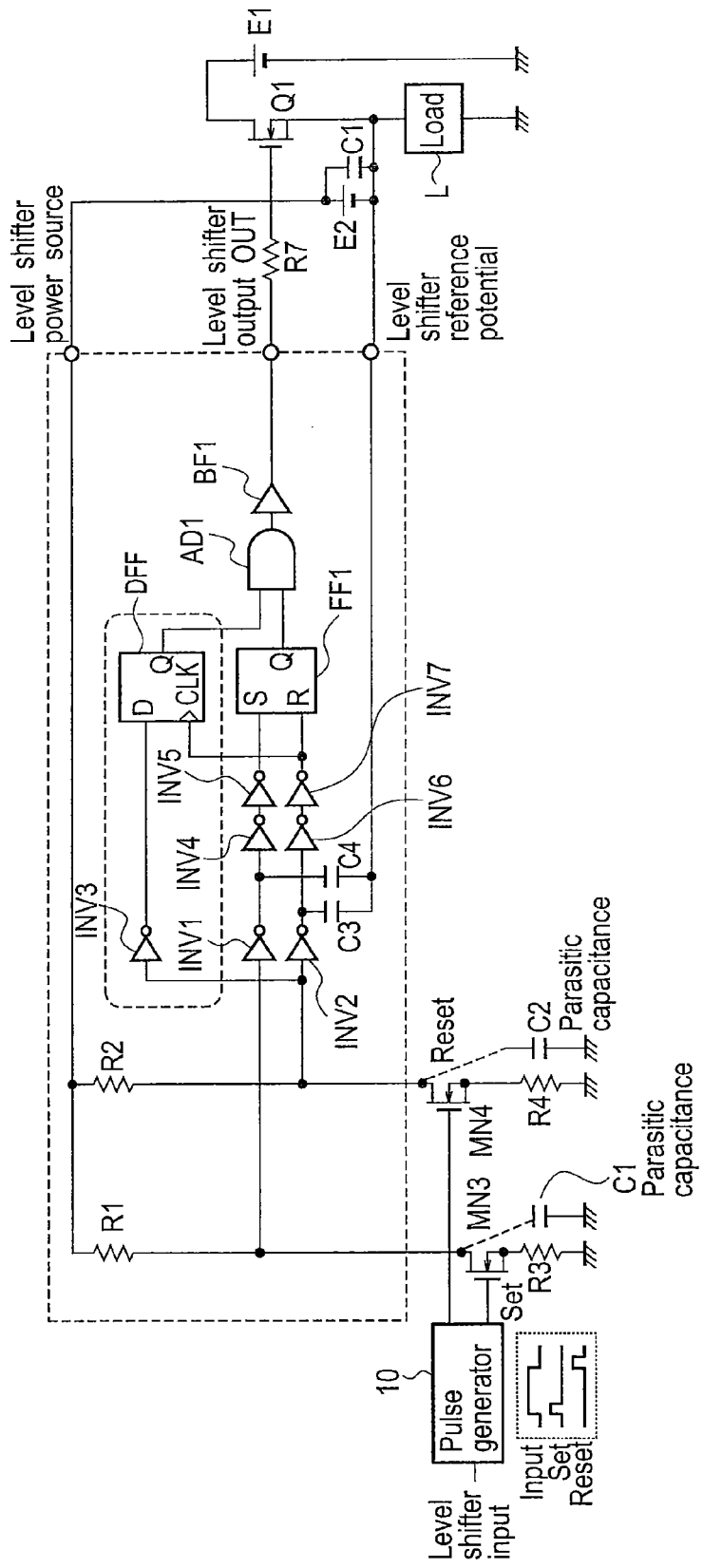
FIG. 11 is a circuit diagram illustrating a level shifter according to a modification of Embodiment 3 of the present invention.

FIG. 11 is a circuit diagram illustrating a level shifter according to a modification of Embodiment 3 of the present invention. According to Embodiment 3 illustrated in FIG. 8, the level shifter stops the switching element Q1 according to a set signal if the reference potential of the level shifter decreases to negative. To realize this, Embodiment 3 connects the second end of the resistor R1 to the input terminal of the inverter INV3 and the output terminal of the inverter INV5 to the clock terminal CLK of the D-type flip-flop DFF.

On the other hand, the level shifter according to the modification of Embodiment 3 illustrated in FIG. 11 stops the switching element Q1 according to a reset signal if the reference potential of the level shifter decreases to negative. To realize this, the modification of Embodiment 3 connects the second end of the resistor R2 to the input terminal of the inverter INV3 and the output terminal of the inverter INV7 to the clock terminal CLK of the D-type flip-flop DFF.

The level shifter according to the modification of Embodiment 3 illustrated in FIG. 11 operates like the level shifter according to Embodiment 3 illustrated in FIG. 8 and provides similar effects. When the reference potential becomes negative, the modification of Embodiment 3 is capable of stopping the switching element Q1 according to a reset signal.

Embodiment 4

Figure 12:
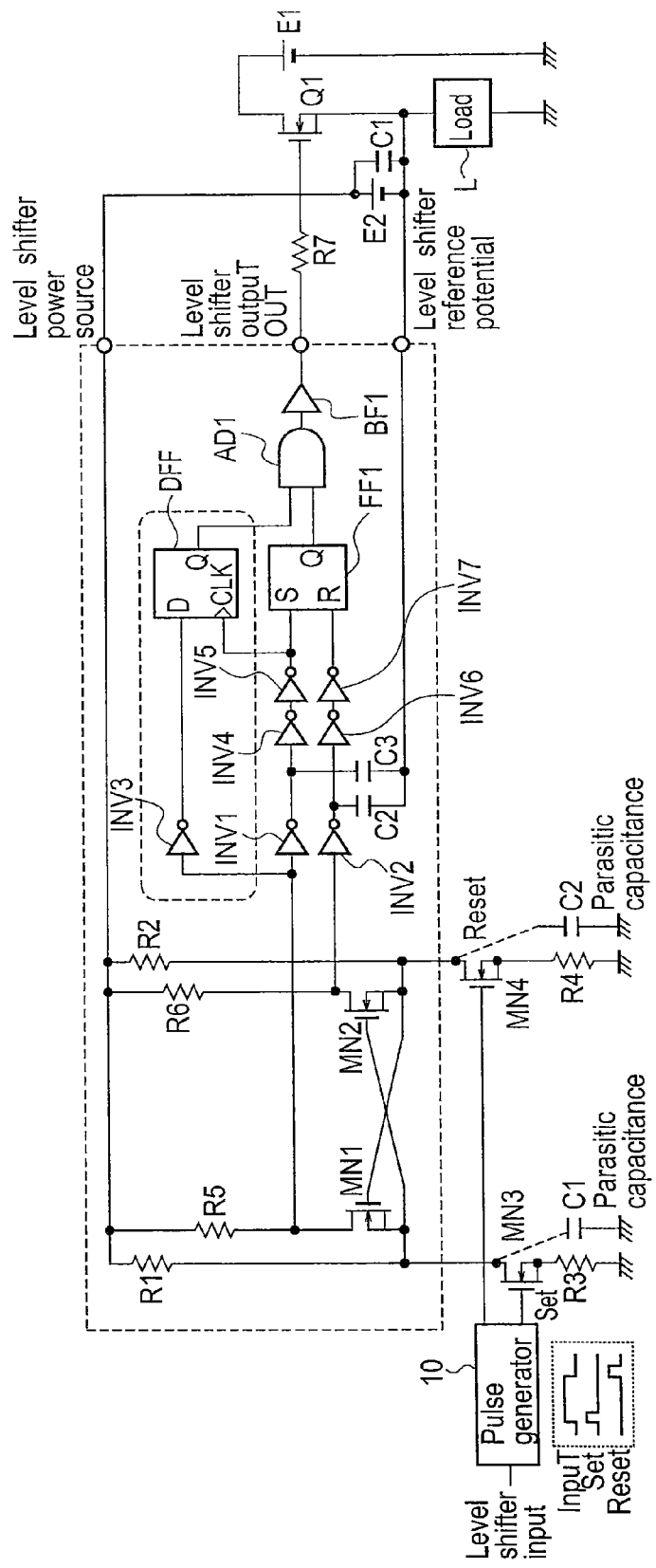
FIG. 12 is a circuit diagram illustrating a level shifter according to Embodiment 4 of the present invention.

FIG. 12 is a circuit diagram illustrating a level shifter according to Embodiment 4 of the present invention. Compared with Embodiment 3 illustrated in FIG. 8, Embodiment 4 additionally employs resistors R5 and R6 and transistors MN1 and MN2. According to Embodiment 4, both ends of a resistor R1 are connected to a series circuit including the resistor R5 and transistor MN1 and both ends of a resistor R2 are connected to a series circuit including the resistor R6 and transistor MN2.

A connection point of the resistor R5 and transistor MN1 is connected to input terminals of inverters INV1 and INV3. A connection point of the resistor R6 and transistor MN2 is connected to an input terminal of an inverter INV2.

The inverter INV1 has the input terminal connected to a second end of the resistor R5 and an output terminal connected through inverters INV4 and INV5 to a set terminal S of a flip-flop FF1. When a voltage across the resistor R5 exceeds a voltage difference between a power source potential VB and a threshold VTH1, the inverter INV1 outputs an inverted signal of an input signal to an input terminal of the inverter INV4.

The inverter INV2 has the input terminal connected to a second end of the resistor R6 and an output terminal connected through inverters INV6 and INV7 to a reset terminal R of the flip-flop FF1. When a voltage across the resistor R6 exceeds a voltage difference between the power source potential VB and a threshold VTH2, the inverter INV2 outputs an inverted signal of the input signal to the reset terminal R of the flip-flop FF1.

The inverter INV3 has the input terminal connected to the second end of the resistor R5 and an output terminal connected to a set terminal D of a D-type flip-flop DFF. When the voltage across the resistor R5 exceeds a voltage difference between the power source potential VB and the threshold VTH2, the inverter INV3 outputs an inverted signal of the input signal to the set terminal D of the D-type flip-flop DFF. Here, the voltage difference between the power source potential VB and the threshold VTH2 is greater than the voltage difference between the power source potential VB and the threshold VTH1.

The remaining configuration of Embodiment 4 is the same as Embodiment 3 of FIG. 8, and therefore, the other explanations are omitted.

The level shifter according to Embodiment 4 operates like the level shifter according to Embodiment 3 and provides similar effects.

Modification of Embodiment 4

Figure 13:
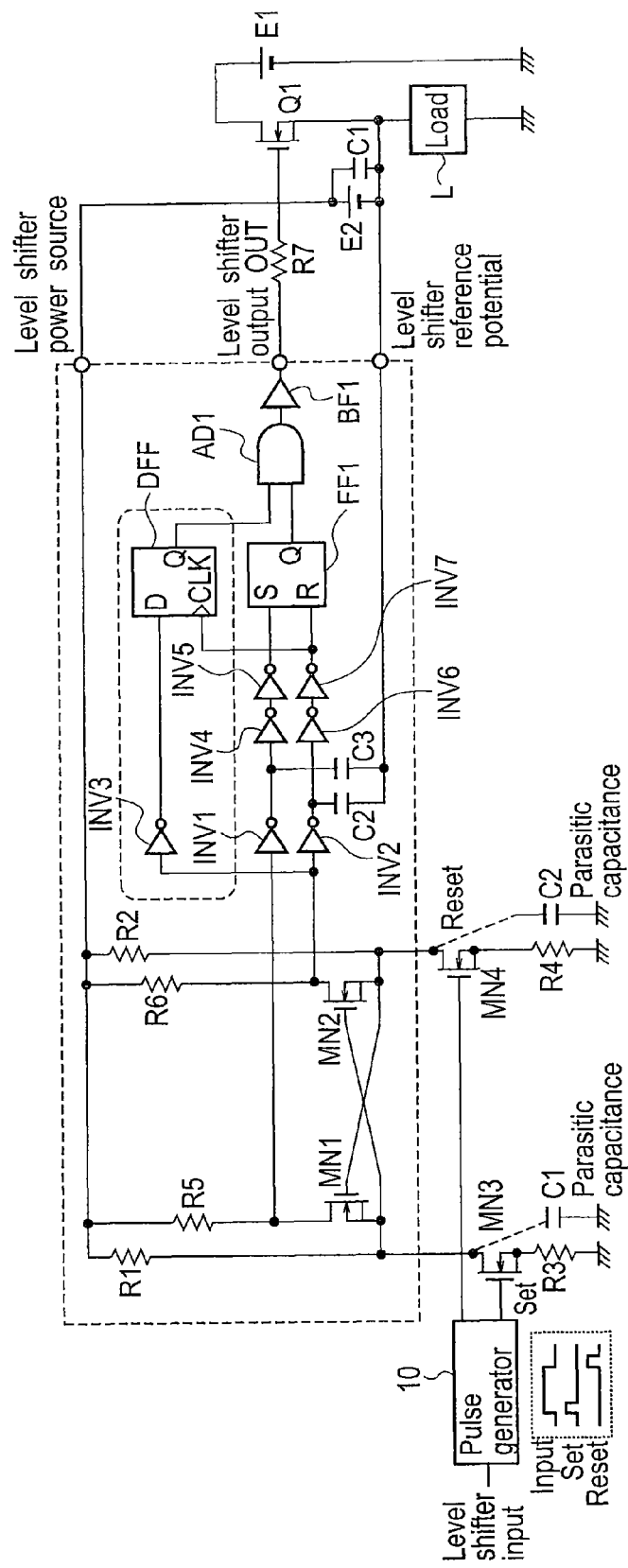
FIG. 13 is a circuit diagram illustrating a level shifter according to a modification of Embodiment 4 of the present invention.

FIG. 13 is a circuit diagram illustrating a level shifter according to a modification of Embodiment 4. According to Embodiment 4 illustrated in FIG. 12, the level shifter stops the switching element Q1 according to a set signal when the reference potential becomes negative. To realize this, Embodiment 4 connects the second end of the resistor R5 to the input terminal of the inverter INV3 and the output terminal of the inverter INV5 to the clock terminal CLK of the D-type flip-flop DFF.

On the other hand, the level shifter according to the modification of Embodiment 4 illustrated in FIG. 13 stops the switching element Q1 according to a reset signal when the reference potential becomes negative. To realize this, the modification of Embodiment 4 connects the second end of the resistor R6 to the input terminal of the inverter INV3 and the output terminal of the inverter INV7 to the clock terminal CLK of the D-type flip-flop DFF.

The level shifter according to the modification of Embodiment 4 illustrated in FIG. 13 operates like the level shifter according to Embodiment 4 illustrated in FIG. 12 and provides similar effects. When the reference potential becomes negative, the modification of Embodiment 4 is capable of stopping the switching element Q1 according to a reset signal.

The present invention is not limited to the level shifters of Embodiments 1 to 4 and modifications thereof. The present invention determines whether or not the level shifter can sufficiently transmit a signal from a low side to a high side, and according to the determination, controls ON/OFF of high-side pulse signals. Determining whether or not the level shifter can properly transmit a signal from a low side to a high side may be made in any part of the level shifter. For example, Embodiments 1, 2, and 4 each test whether or not a signal is properly transmittable on a reset signal transmitting side. Instead, these embodiments each may conduct the test on a set signal transmitting side, like Embodiment 3.

Embodiments 1 to 4 each employ inverters having different thresholds. Instead, it is possible to employ comparators and p-channel MOSFETs having different transconductance (gm).

As mentioned above, the level shifter according to the present invention employs the switching operation control part that detects when reference potential of the level shifter becomes negative and stops the operation of a switching element. If the reference potential becomes negative, the level shifter according to the present invention safely and surely stops the operation of the switching element.

This application claims benefit of priority under 35USC §119 to Japanese Patent Application No. 2012-005100, filed on Jan. 13, 2012, the entire contents of which are incorporated by reference herein.

What is claimed is:

1. A level shifter comprising:
  a first resistor having a first end connected to a power source of the level shifter;
  a first n-type MOSFET having a drain connected to a second end of the first resistor and a source connected to the ground;
  a second resistor having the same resistance as the first resistor and having a first end connected to the power source;
  a second n-type MOSFET having a drain connected to a second end of the second resistor and a source connected to the ground;
  a pulse generator configured to control ON/OFF of the first and second n-type MOSFETs according to an input signal;
  a controller configured to generate a set signal when the first n-type MOSFET is ON, the controller including:
    a third resistor having a first end connected to the power source of the level shifter;
    a third n-type MOSFET having a drain connected to a second end of the third resistor and a set terminal of the flip-flop, a source connected to the drain of the first n-type MOSFET, and a gate connected to the drain of the second n-type MOSFET;

a fourth resistor having the same resistance as the third resistor and having a first end connected to the power source of the level shifter; and a fourth n-type MOSFET having a drain connected to a second end of the fourth resistor and a reset terminal of the flip-flop, a source connected to the drain of the second n-type MOSFET, and a gate connected to the drain of the first n-type MOSFET;

a flip-flop providing an output signal that is a level-shifted signal of the input signal to operate a switching element according to the set and reset signals generated by the controller; and a switching operation controller configured to detect when reference potential of the level shifter at a negative electrode of the power source decreases to negative and stop the operation of the switching element, the switching operation controller including:

a first inverter that provides the flip-flop with an inverted signal of a voltage across one of the third and fourth resistors when the voltage across the resistor exceeds a voltage difference between the power source potential and a first threshold;

a second inverter that outputs an inverted signal of the voltage across one of the third and fourth resistors when the voltage across the resistor exceeds a second threshold that is greater than the voltage difference between the power source potential and the first threshold;

wherein according to the output from the second inverter, the set signal stops the operation of the switching element when the voltage across one of the third and fourth resistors is greater than the voltage difference between the power source potential and the first threshold and smaller than a voltage difference between the power source potential and the second threshold.

2. The level shifter of claim 1, further comprising:
a fifth resistor connected between the source of the first n-type MOSFET and the ground;
a sixth resistor connected between the source of the second n-type MOSFET and the ground;
a comparator that compares a voltage across one of the fifth and sixth resistors with a reference voltage;
wherein, one of the first and second n-type MOSFETs stops the operation of the switching element if the voltage across one of the fifth and sixth resistors is smaller than the reference voltage.

3. A level shifter comprising:
a first resistor having a first end connected to a power source of the level shifter;
a first n-type MOSFET having a drain connected to a second end of the first resistor and a source connected to the ground;
a second resistor having the same resistance as the first resistor and having a first end connected to the power source;
a second n-type MOSFET having a drain connected to a second end of the second resistor and a source connected to the ground;
a pulse generator configured to control ON/OFF of the first and second n-type MOSFETs according to an input signal;
a controller configured to generate a set signal when the first n-type MOSFET is ON and a reset signal when the second n-type MOSFET is ON, the controller including:
a third resistor having a first end connected to the power source of the level shifter;

a third n-type MOSFET having a drain connected to a second end of the third resistor and a set terminal of the flip-flop, a source connected to the drain of the first n-type MOSFET, and a gate connected to the drain of the second n-type MOSFET;

a fourth resistor having the same resistance as the third resistor and having a first end connected to the power source of the level shifter; and a fourth n-type MOSFET having a drain connected to a second end of the fourth resistor and a reset terminal of the flip-flop, a source connected to the drain of the second n-type MOSFET, and a gate connected to the drain of the first n-type MOSFET;

a flip-flop providing an output signal that is a level-shifted signal of the input signal to operate a switching element according to the set and reset signals generated by the controller; and a switching operation controller configured to detect when reference potential of the level shifter at a negative electrode of the power source decreases to negative and stop the operation of the switching element, the switching operation controller including:

a first inverter that outputs an inverted signal of a voltage across one of the first and second resistors when the voltage across the resistor exceeds a voltage difference between the power source potential and a first threshold;

a second inverter that outputs an inverted signal of the voltage across one of the first and second resistors when the voltage across the resistor exceeds a second threshold that is greater than the voltage difference between the power source potential and the first threshold;

wherein, according to the output from the second inverter, the set signal stops the operation of the switching element when the voltage across one of the first and second resistors is greater than the voltage difference between the power source potential and the first threshold and smaller than a voltage difference between the power source potential and the second threshold.

4. A level shifter comprising:
a first resistor having a first end connected to a power source of the level shifter;
a first n-type MOSFET having a drain connected to a second end of the first resistor and a source connected to the ground;
a second resistor having the same resistance as the first resistor and having a first end connected to the power source;
a second n-type MOSFET having a drain connected to a second end of the second resistor and a source connected to the ground;
a pulse generator configured to control ON/OFF of the first and second n-type MOSFETs according to an input signal;
a controller configured to generate a set signal when the first n-type MOSFET is ON and a reset signal when the second n-type MOSFET is ON, the controller including:
a third resistor having a first end connected to the power source of the level shifter;
a third n-type MOSFET having a drain connected to a second end of the third resistor and a set terminal of the flip-flop, a source connected to the drain of the first n-type MOSFET, and a gate connected to the drain of the second n-type MOSFET;

a fourth resistor provided having the same resistance as the third resistor and having a first end connected to the power source; and a fourth n-type MOSFET having a drain connected to a second end of the fourth resistor and a reset terminal of the flip-flop, a source connected to the drain of the second n-type MOSFET, and a gate connected to the drain of the first n-type MOSFET;

a flip-flop providing an output signal that is a level-shifted signal of the input signal to operate a switching element according to the set and reset signals generated by the controller; and a switching operation controller configured to detect when reference potential of the level shifter at a negative electrode of the power source decreases to negative and stop the operation of the switching element, the switching operation controller including:

a first inverter that outputs an inverted signal of a voltage across one of the third and fourth resistors when the voltage across the resistor exceeds a voltage difference between the power source potential and a first threshold;

a second inverter that outputs an inverted signal of the voltage across one of the third and fourth resistors when the voltage across the resistor exceeds a second threshold that is greater than the voltage difference between the power source potential and the first threshold;

wherein, according to the outputs from the first and second inverters, the set signal to thereby stop the operation of the switching element when the voltage across one of the third and fourth resistors is greater than the voltage difference between the power source potential and the first threshold and smaller than a voltage difference between the power source potential and the second threshold.

* * * * *